(12) United States Patent
Sekiya

(10) Patent No.: US 8,802,470 B2
(45) Date of Patent: Aug. 12, 2014

(54) OPTICAL DEVICE PROCESSING METHOD

(71) Applicant: Disco Corporation, Tokyo (JP)

(72) Inventor: Kazuma Sekiya, Tokyo (JP)

(73) Assignee: Disco, Corporation, Tokyo (JP)

( * ) Notice: Subject to any disclaimer, the term of this patent is extended or adjusted under 35 U.S.C. 154(b) by 0 days.

(21) Appl. No.: 13/909,813

(22) Filed: Jun. 4, 2013

(65) Prior Publication Data

US 2013/0330857 A1    Dec. 12, 2013

(30) Foreign Application Priority Data

Jun. 12, 2012 (JP) .................... 2012-132747

(51) Int. Cl.
*H01L 33/58*      (2010.01)

(52) U.S. Cl.
USPC ........... 438/33; 438/26; 438/27; 438/42; 257/E21.001

(58) Field of Classification Search
USPC .......................................... 438/33
See application file for complete search history.

(56) References Cited

U.S. PATENT DOCUMENTS

| | | | |
|---|---|---|---|
| 7,446,344 B2 | 11/2008 | Fehrer et al. | |
| 7,795,126 B2 | 9/2010 | Prabhu et al. | |
| 8,497,146 B2 * | 7/2013 | Odnoblyudov et al. | 438/33 |
| 8,653,547 B2 | 2/2014 | Jeong et al. | |
| 2003/0151064 A1 | 8/2003 | Ohno et al. | |
| 2003/0209772 A1 | 11/2003 | Prabhu | |
| 2005/0250234 A1 | 11/2005 | Kamikawa et al. | |
| 2006/0154389 A1 * | 7/2006 | Doan | 438/21 |
| 2008/0035949 A1 * | 2/2008 | Fudeta et al. | 257/99 |
| 2009/0218590 A1 | 9/2009 | Cai et al. | |
| 2009/0267100 A1 | 10/2009 | Miyake et al. | |
| 2010/0283075 A1 * | 11/2010 | McKenzie et al. | 257/98 |
| 2011/0128980 A1 | 6/2011 | Kato | |
| 2011/0284911 A1 | 11/2011 | Chiang | |
| 2012/0326178 A1 | 12/2012 | Fehrer et al. | |
| 2013/0330856 A1 * | 12/2013 | Sekiya | 438/27 |

FOREIGN PATENT DOCUMENTS

JP      04-010670      1/1992

* cited by examiner

*Primary Examiner* — Angel Roman
(74) *Attorney, Agent, or Firm* — Greer Burns & Crain, Ltd.

(57) ABSTRACT

An optical device processing method including a protective layer includes forming a protective layer of an insulator on the front side of an optical device wafer so as to insulate at least the electrodes from each other, forming a groove on the front side of the wafer along each division line, forming a reflective film on the front side of the wafer to thereby form the reflective film on at least the side surfaces of the groove, removing the protective layer formed on the electrodes on the front side of the wafer to thereby expose the electrodes, and grinding a back side of the wafer to thereby reduce the thickness of the wafer to the finished thickness until the groove is exposed to the back side of the wafer to divide the wafer into individual optical device chips.

3 Claims, 7 Drawing Sheets

OPTICAL DEVICE PROCESSING METHOD

BACKGROUND OF THE INVENTION

1. Field of the Invention

The present invention relates to an optical device processing method.

2. Description of the Related Art

A plurality of optical devices such as LEDs (Light Emitting Diodes) and LDs (Laser Diodes) are formed by growing an epitaxial layer (crystal layer) on a substrate for crystal growth and forming a plurality of crossing division lines for partitioning the epitaxial layer into a plurality of regions where the plural optical devices are respectively formed. The crystal growth substrate having the plural optical devices is divided along the division lines to obtain a plurality of individual optical device chips.

In an optical device chip having a light emitting layer of InGaN for emitting green or blue light, sapphire is generally used for the crystal growth substrate. An n-type GaN semiconductor layer, an InGaN light emitting layer, and a p-type GaN semiconductor layer are sequentially formed on the sapphire substrate by epitaxial growth. Further, electrodes for external connection are respectively formed on the n-type GaN semiconductor layer and the p-type GaN semiconductor layer, thus forming an optical device.

In an optical device such as LEDs, higher luminance is demanded, and it is therefore desired to improve light extraction efficiency. In recent years, an optical device mounted by flip-chip bonding as disclosed in Japanese Patent Laid-open No. Hei 4-10670 has already been widely spread in the market. In such a flip-chip mounted optical device, light emitted from the light emitting layer toward the outside is not blocked by the electrodes, so that the light extraction efficiency is improved over an optical device mounted by conventional wire bonding.

SUMMARY OF THE INVENTION

It is known that the luminous efficiency of a flip-chip mounted LED is improved by tens of percents over an LED mounted by wire bonding. However, a further improvement in light extraction efficiency is desired.

It is therefore an object of the present invention to provide an optical device processing method which can further improve the light extraction efficiency.

In accordance with an aspect of the present invention, there is provided an optical device processing method for processing an optical device wafer having a plurality of optical devices formed on a front side and a plurality of crossing division lines for partitioning the optical devices, each of the optical devices having electrodes formed on the front side. The optical device processing method includes: a protective layer forming step of forming a protective layer of an insulator on the front side of the optical device wafer so as to insulate at least the electrodes from each other; a groove forming step of forming a groove on the front side of the optical device wafer along each division line after performing the protective layer forming step, the groove having a depth reaching a finished thickness; a reflective film forming step of forming a reflective film on the front side of the optical device wafer after performing the groove forming step, thereby forming the reflective film on at least side surfaces of the groove; an electrode exposing step of removing the protective layer formed on the electrodes on the front side of the optical device wafer after performing the reflective film forming step, thereby exposing the electrodes; and a grinding step of grinding a back side of the optical device wafer before or after performing the electrode exposing step, thereby reducing the thickness of the optical device wafer to the finished thickness until the groove is exposed to the back side of the optical device wafer to divide the optical device wafer into individual optical device chips.

Preferably, the protective layer is formed over the entire surface on the front side of the optical device wafer in the protective layer forming step; and the protective layer formed on the front side of the optical device wafer is cut off by using tool cutting means to thereby expose the electrodes in the electrode exposing step.

Preferably, the optical device processing method of the present invention further includes: a mounting step of flip-chip mounting each optical device chip on a substrate after performing the grinding step; and a sealing step of sealing each optical device chip mounted on the substrate with a sealing member.

According to the optical device processing method of the present invention, the reflective film is formed on the side surfaces of each optical device chip to thereby prevent the problem that light emitted from a light emitting layer may emerge from the side surfaces of the optical device chip. Furthermore, the back side of each optical device chip is a ground surface having minute irregularities formed by the grinding step. Accordingly, totally reflected light in the optical device chip can be reduced by the minute irregularities to thereby improve the light extraction efficiency.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
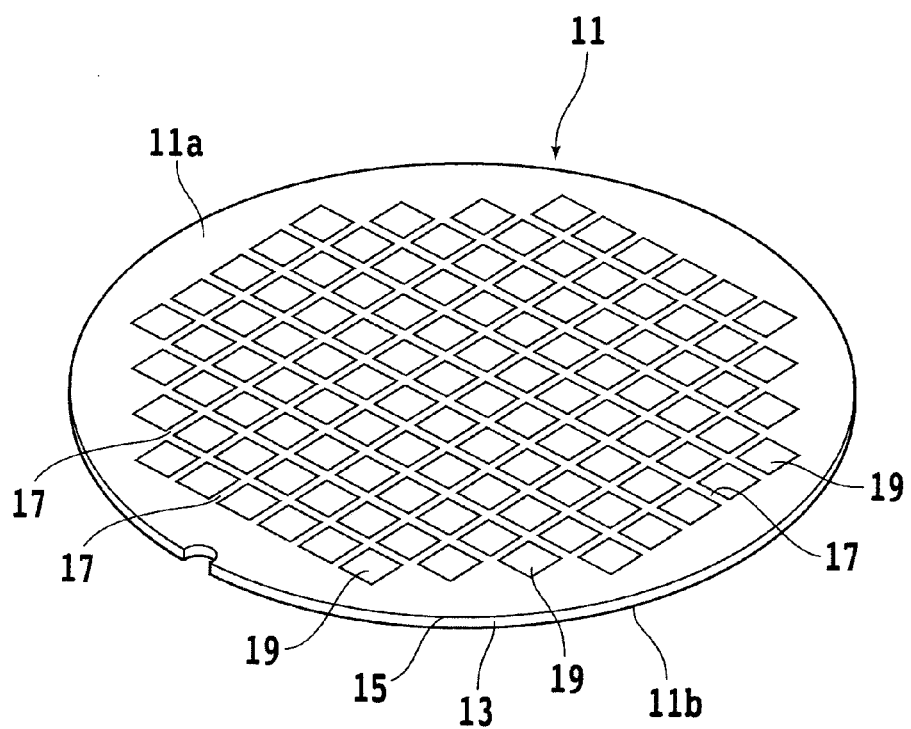
FIG. 1 is a perspective view of an optical device wafer as viewed from a front side thereof.
Figure 2:
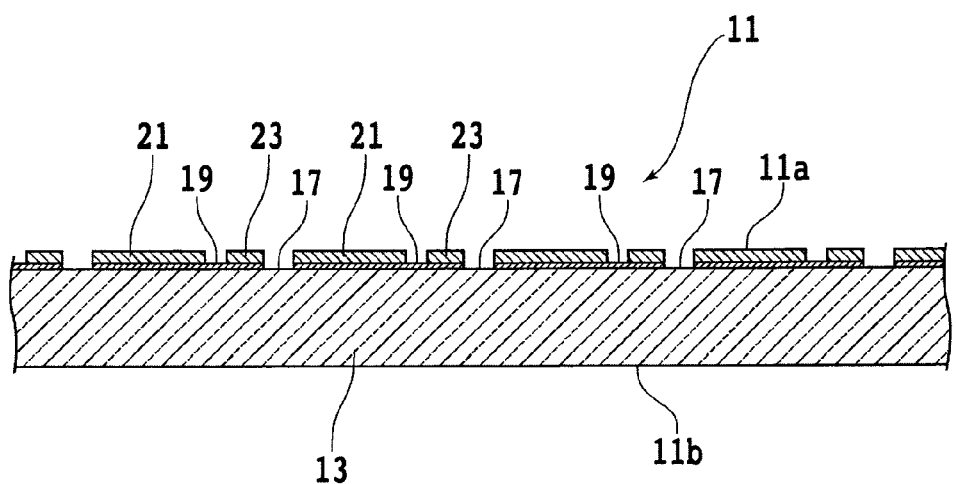
FIG. 2 is a vertical sectional view of the optical device wafer shown in FIG. 1.

A preferred embodiment of the present invention will now be described in detail with reference to the drawings. Referring to FIG. 1, there is shown a perspective view of an optical device wafer 11 as viewed from a front side thereof. The optical device wafer 11 is composed of a sapphire substrate 13 and an epitaxial layer (light emitting layer) 15 formed on the sapphire substrate 13. The epitaxial layer 15 is formed of gallium nitride (GaN), for example. The optical device wafer 11 has a front side 11a where the epitaxial layer 15 is formed and a back side 11b where the sapphire substrate 13 is exposed. The epitaxial layer 15 is formed with a plurality of optical devices 19 such as LEDs partitioned by a plurality of crossing division lines (streets) 17. As shown in FIG. 2, each optical device 19 is provided with a pair of electrodes 21 and 23.

Figure 3:
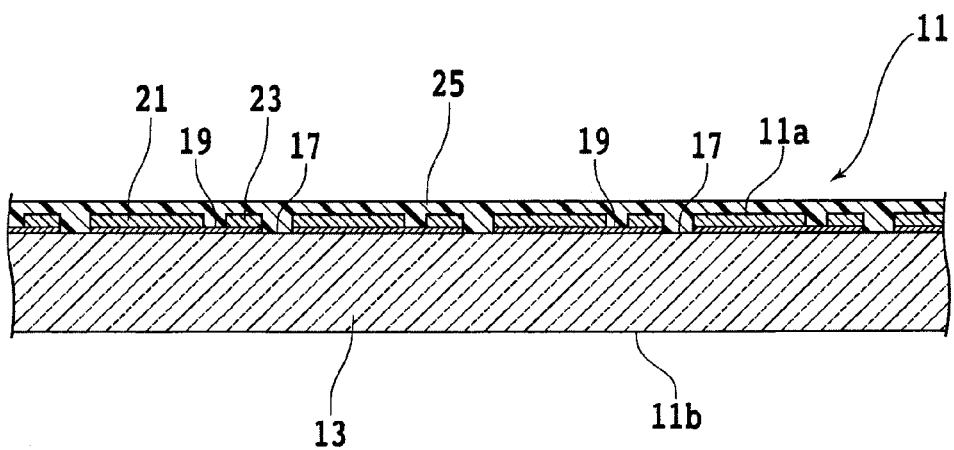
FIG. 3 is a vertical sectional view of the optical device wafer in a condition obtained by performing a protective layer forming step.

The optical device processing method of the present invention will now be described. As shown in FIG. 3, a protective layer forming step is first performed in such a manner that a protective layer 25 of an insulator is formed on the front side 11a of the optical device wafer 11 to thereby insulate the electrodes 21 and 23 from each other. While the protective layer 25 is formed over the entire surface on the front side 11a of the optical device wafer 11 in this preferred embodiment shown in FIG. 3, it is sufficient that the protective layer 25 is to be formed so as to insulate at least the electrodes 21 and 23 from each other.

Figure 4:
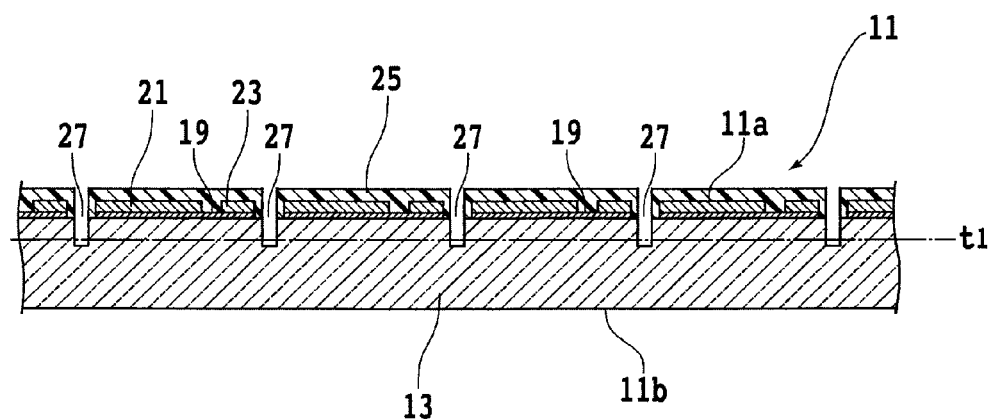
FIG. 4 is a vertical sectional view of the optical device wafer in a condition obtained by performing a groove forming step.

After performing the protective layer forming step mentioned above, a groove forming step is performed as shown in FIG. 4 in such a manner that a groove 27 having a depth reaching a finished thickness t1 is formed along each division line 17 on the front side 11a of the optical device wafer 11. In the case that a water-soluble resin is used as the protective layer 25, the formation of the groove 27 is preferably performed by applying a laser beam having an absorption wavelength (e.g., 355 nm) to the sapphire substrate 13 to thereby ablate the sapphire substrate 13 together with the protective layer 25. As a modification, a protective layer may be formed of a water-insoluble material and each groove 27 may be formed by using a cutting blade to cut the sapphire substrate 13 together with the protective layer 25.

Figure 5:
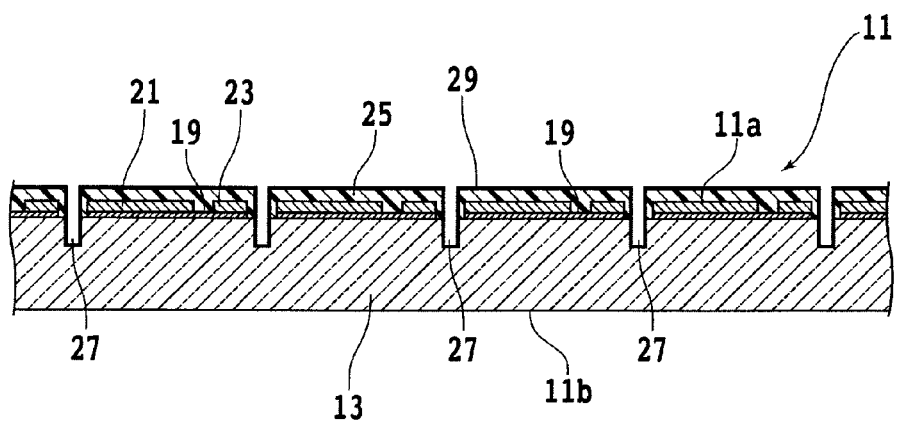
FIG. 5 is a vertical sectional view of the optical device wafer in a condition obtained by performing a reflective film forming step.

After performing the groove forming step mentioned above, a reflective film forming step is performed as shown in FIG. 5 in such a manner that a reflective film 29 of aluminum (Al), for example, is formed on the protective layer 25 and in each groove 27 by evaporation or the like. By performing this reflective film forming step, the reflective film 29 is formed also on side surfaces of each groove 27. After performing the reflective film forming step mentioned above, an electrode exposing step is performed in such a manner that the protective layer 25 formed on the electrodes 21 and 23 on the front side 11a of the optical device wafer 11 is removed to expose the electrodes 21 and 23.

Figure 6:
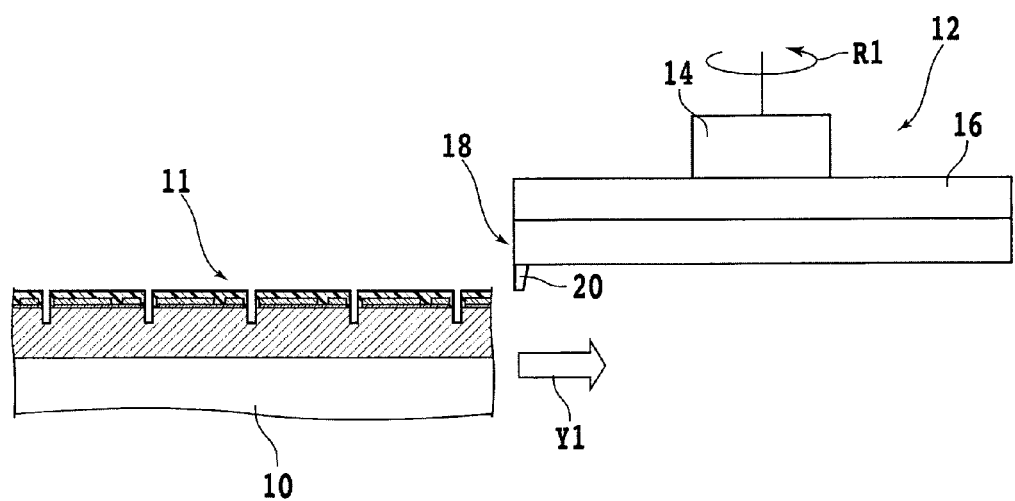
FIG. 6 is a partially sectional side view showing an electrode exposing step.

This electrode exposing step is performed by using a tool cutting apparatus for cutting a workpiece as shown in FIG. 6. The tool cutting apparatus has a tool cutting unit 12. The tool cutting unit 12 includes a spindle 14 adapted to be rotationally driven, a wheel mount 16 fixed to a lower end of the spindle 14, and a tool wheel 18 mounted on a lower surface of the wheel mount 16. The tool wheel 18 has a cutting tool 20. Although schematically shown in FIG. 6, the diameter of the tool wheel 18 is greater than or equal to the diameter of the optical device wafer 11.

Figure 7:
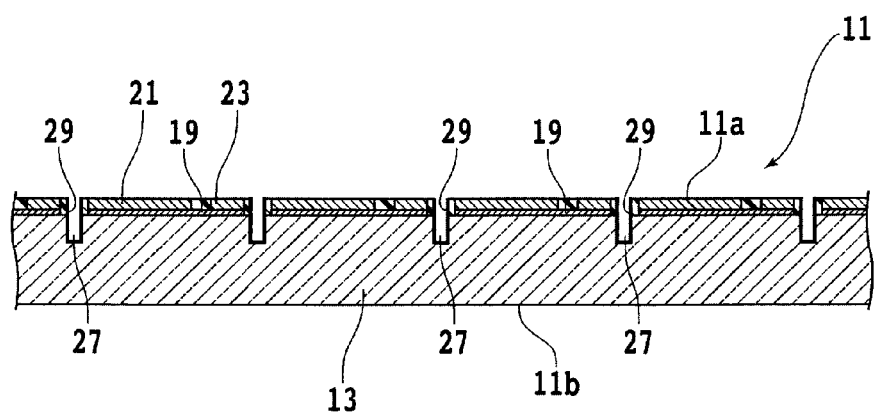
FIG. 7 is a vertical sectional view of the optical device wafer in a condition obtained by performing the electrode exposing step shown in FIG. 6.

In operation, the tool wheel 18 is rotated in a direction shown by an arrow R1 in FIG. 6 and the tool cutting unit 12 is lowered to make the cutting tool 20 cut into the protective layer 25 formed on the front side 11a of the optical device wafer 11 by a predetermined depth. At the same time, a chuck table 10 is linearly moved in a direction shown by an arrow Y1 in FIG. 6, thereby cutting off the protective layer 25 with the cutting tool 20. In a case that the electrodes 21 and 23 are not exposed by one cycle of cutting using the cutting tool 20, plural cycles of this cutting are performed to expose the electrodes 21 and 23 from the protective layer 25. In this manner, the electrode exposing step is performed to obtain a condition shown in FIG. 7, in which the protective layer 25 and the reflective film 29 formed on the protective layer 25 have been removed to expose the electrodes 21 and 23. However, the reflective film 29 in each groove 27 is left.

Figure 8:
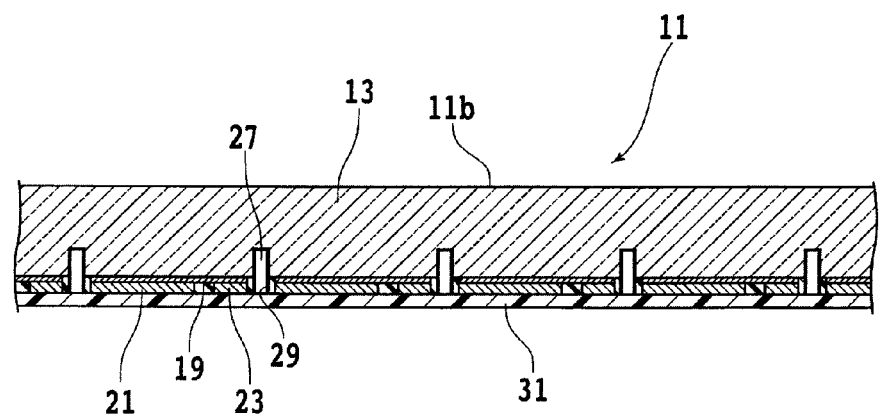
FIG. 8 is a vertical sectional view of the optical device wafer in a condition obtained by performing a protective tape attaching step.
Figure 9:
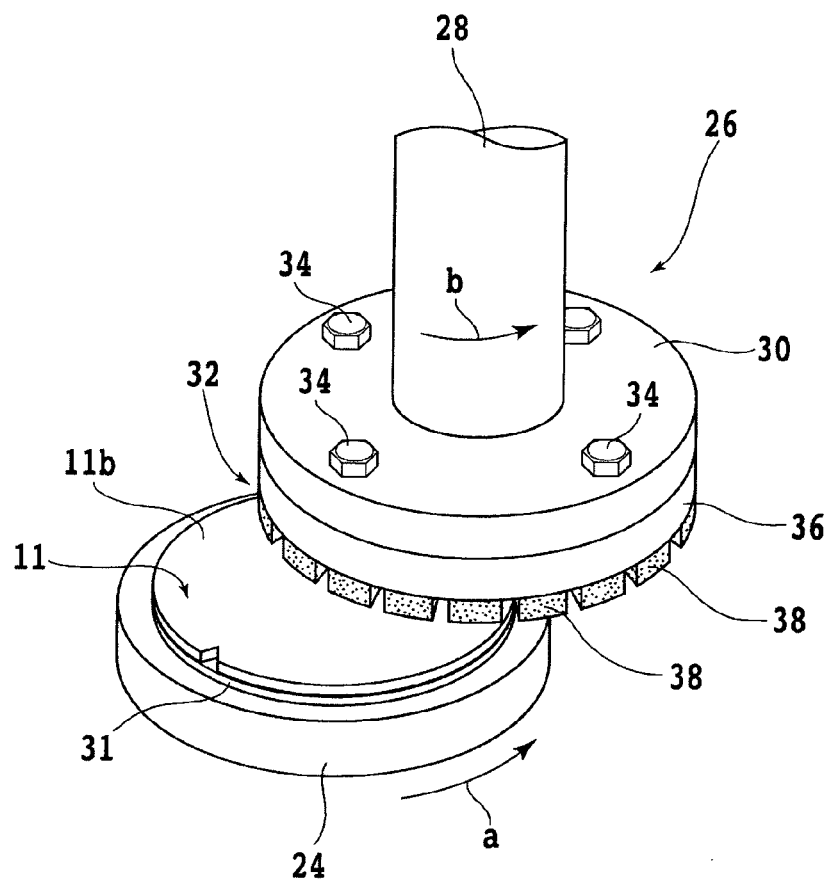
FIG. 9 is a perspective view showing a grinding step.

Thereafter, a protective tape 31 is attached to the front side 11a of the optical device wafer 11 as shown in FIG. 8 (protective tape attaching step). Thereafter, a grinding step is performed as shown in FIG. 9 in such a manner that the protective tape 31 attached to the front side 11a of the optical device wafer 11 is held under suction on a chuck table 24 of a grinding apparatus and the back side 11b of the optical device wafer 11 is ground by a grinding unit 26. The grinding unit 26 includes a spindle 28 adapted to be rotationally driven, a wheel mount 30 fixed to a lower end of the spindle 28, and a grinding wheel 32 detachably mounted on a lower surface of the wheel mount 30 by a plurality of screws 34. The grinding wheel 32 is composed of an annular base 36 and a plurality of abrasive members 38 fixed to a free end (lower surface) of the annular base 36. Each abrasive member 38 is formed by bonding diamond abrasive grains having a large grain size with a vitrified bond or the like.

Figure 10:
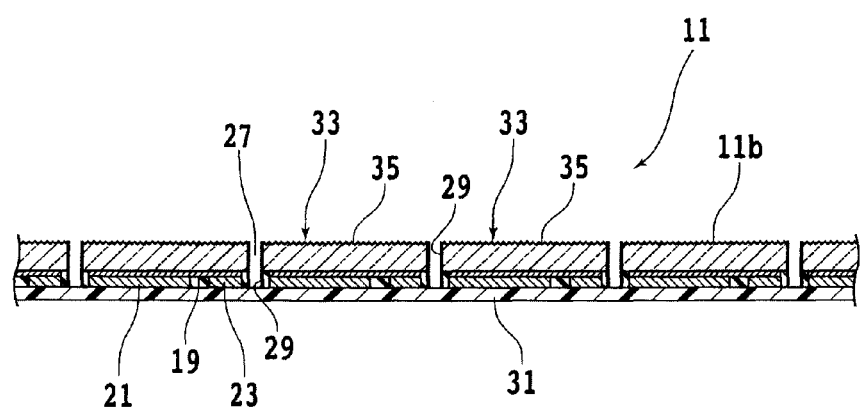
FIG. 10 is a vertical sectional view of the optical device wafer in a condition obtained by performing the grinding step shown in FIG. 9.

In this grinding step, the chuck table 24 is rotated in a direction shown by an arrow a in FIG. 9 at 300 rpm, for example, and the grinding wheel 32 is also rotated in the same direction as that of the chuck table 24, i.e., in a direction shown by an arrow b in FIG. 9 at 1000 rpm, for example. In this condition, a grinding unit feeding mechanism (not shown) is operated to bring the abrasive members 38 into contact with the sapphire substrate 13 exposed to the back side 11b of the optical device wafer 11. Thereafter, the grinding wheel 32 is fed downward at a predetermined feed speed by a predetermined amount to thereby grind the sapphire substrate 13. When the sapphire substrate 13 is ground till the finished thickness t1, the optical device wafer 11 is divided into individual optical device chips 33 as shown in FIG. 10 because each groove 27 has a depth reaching the finished thickness t1. Each abrasive member 38 used in this grinding step is a coarse grinding member containing abrasive grains having a large grain size. Accordingly, minute irregularities 35 are formed on the ground surface of each optical device chip 33 as shown in FIG. 10.

Figure 11:
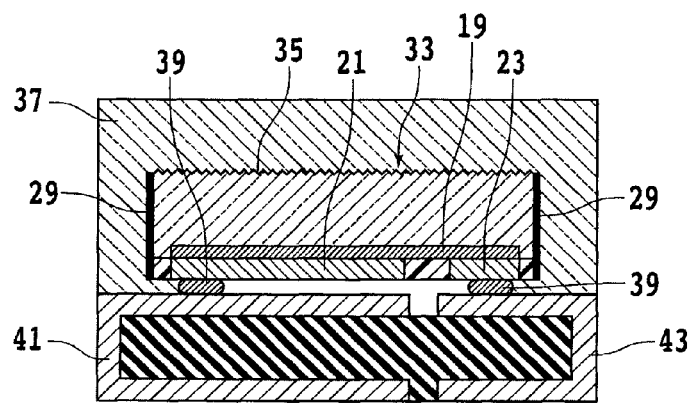
FIG. 11 is a vertical sectional view of an optical device chip mounted on a substrate and sealed.

After performing the grinding step mentioned above, a mounting step and a sealing step are performed in the following manner. The protective tape 31 is peeled from the front side 11a of the optical device wafer 11, and each optical device chip 33 is flip-chip mounted on electrodes 41 and 43 of a substrate through solder members 39 as shown in FIG. 11 (mounting step). Thereafter, each optical device chip 33 is sealed with a sealing member 37 formed from a transparent resin such as epoxy resin (sealing step). In the optical device chip 33 sealed with the sealing member 37, the reflective film 29 is formed on the side surfaces of the optical device chip 33 to thereby prevent the problem that light emitted from the light emitting layer 15 may emerge from the side surfaces of the optical device chip 33. Furthermore, the back side of each optical device chip 33 is a coarsely ground surface having the minute irregularities 35 formed by the grinding step. Accordingly, totally reflected light in the optical device chip 33 can be reduced by the minute irregularities 35 to thereby improve the light extraction efficiency.

In the above preferred embodiment, the grinding step is performed after performing the electrode exposing step. As a modification, the grinding step may be performed before performing the electrode exposing step. That is, the protective tape 31 is attached to the front side 11*a* of the optical device wafer 11, and the grinding step is performed to grind the back side 11*b* of the optical device wafer 11, thereby dividing the optical device wafer 11 into the individual optical device chips 33. Thereafter, the electrode exposing step is performed to cut off the protective layer 25 by using the tool cutting apparatus, thereby exposing the electrodes 21 and 23.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An optical device processing method for processing an optical device wafer having a plurality of optical devices formed on a front side and a plurality of crossing division lines for partitioning the optical devices, each of the optical devices having electrodes formed on the front side, the optical device processing method comprising:
    a protective layer forming step of forming a protective layer of an insulator on the front side of the optical device wafer so as to insulate at least the electrodes from each other;
    a groove forming step of forming a groove on the front side of the optical device wafer along each division line after performing the protective layer forming step, the groove having a depth reaching a finished thickness;
    a reflective film forming step of forming a reflective film on the front side of the optical device wafer after performing the groove forming step, thereby forming the reflective film on at least side surfaces of the groove;
    an electrode exposing step of removing the protective layer formed on the electrodes on the front side of the optical device wafer after performing the reflective film forming step, thereby exposing the electrodes; and
    a grinding step of grinding a back side of the optical device wafer before or after performing the electrode exposing step, thereby reducing the thickness of the optical device wafer to the finished thickness until the groove is exposed to the back side of the optical device wafer to divide the optical device wafer into individual optical device chips.

2. The optical device processing method according to claim 1, wherein
    the protective layer is formed over the entire surface on the front side of the optical device wafer in the protective layer forming step; and
    the protective layer formed on the front side of the optical device wafer is cut off by using tool cutting means to thereby expose the electrodes in the electrode exposing step.

3. The optical device processing method according to claim 1, further comprising:
    a mounting step of flip-chip mounting each optical device chip on a substrate after performing the grinding step; and
    a sealing step of sealing each optical device chip mounted on the substrate with a sealing member.

* * * * *